(12) United States Patent
Ichinose (10) Patent No.: US 6,747,361 B2
(45) Date of Patent: Jun. 8, 2004

(54) SEMICONDUCTOR DEVICE AND PACKAGING METHOD THEREOF

(75) Inventor: Michihiko Ichinose, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/910,899

(22) Filed: Jul. 24, 2001

(65) Prior Publication Data

US 2002/0011651 A1 Jan. 31, 2002

(30) Foreign Application Priority Data

Jul. 26, 2000 (JP) ...................... 2000/225982

(51) Int. Cl.[7] .............................................. H01L 23/48
(52) U.S. Cl. ...................... 257/784; 257/723; 257/724; 257/790; 257/777
(58) Field of Search .................... 257/784, 723–724, 257/790, 777, 787

(56) References Cited

U.S. PATENT DOCUMENTS

| 5,683,942 A | 11/1997 | Kata et al. |
| 5,963,433 A | * 10/1999 | Kim ........................... 361/813 |
| 6,013,948 A | 1/2000 | Akram et al. |
| 6,060,768 A | * 5/2000 | Hayashida et al. ......... 257/666 |
| 6,072,239 A | 6/2000 | Yoneda et al. |
| 6,147,401 A | * 11/2000 | Solberg ...................... 257/723 |
| 6,221,682 B1 | 4/2001 | Danziger et al. |
| 6,429,532 B1 | 8/2002 | Han et al. |

FOREIGN PATENT DOCUMENTS

| EP | 0 623 954 A1 | 11/1994 |
| JP | 6-53393 A | 2/1994 |
| JP | H6-62382 | 9/1994 |
| JP | 7-22567 A | 1/1995 |
| JP | 7-38240 A | 2/1995 |
| JP | 8-504036 A | 4/1996 |
| JP | 9-17910 A | 1/1997 |
| JP | 11-40617 | 2/1999 |

* cited by examiner

Primary Examiner—Luan Thai
(74) Attorney, Agent, or Firm—Sughrue Mion, PLLC (57) ABSTRACT

A semiconductor chip semiconductor device of the present invention is capable of obtaining a high-quality bare chip (HQC) easily and can retain quality without being affected by the surrounding environment. Electrodes formed on the surface of a first resin sealed package for sealing a semiconductor chip are connected to the electrodes of the semiconductor chip and each electrode comprises a mounting area to be connected to an object to be mounted and a testing area for connecting testing equipment.

4 Claims, 11 Drawing Sheets

SEMICONDUCTOR DEVICE AND PACKAGING METHOD THEREOF

BACKGROUND OF THE INVENTION

1. Field of the Invention

The present invention relates to a semiconductor device and, particularly but not limited, to a bare chip and a packaging method thereof. The present application is based on Japanese Patent Application No. 225982/2000, which is incorporated herein by reference.

2. Background

Figure 1A:
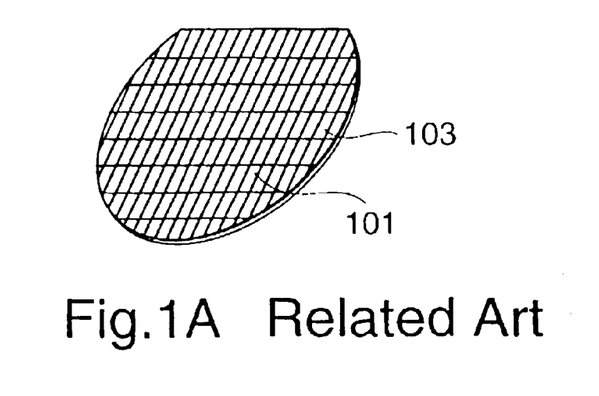
FIG. 1A is a diagram showing the structure of a semiconductor device and a packaging method thereof of the related art.
Figure 1B:
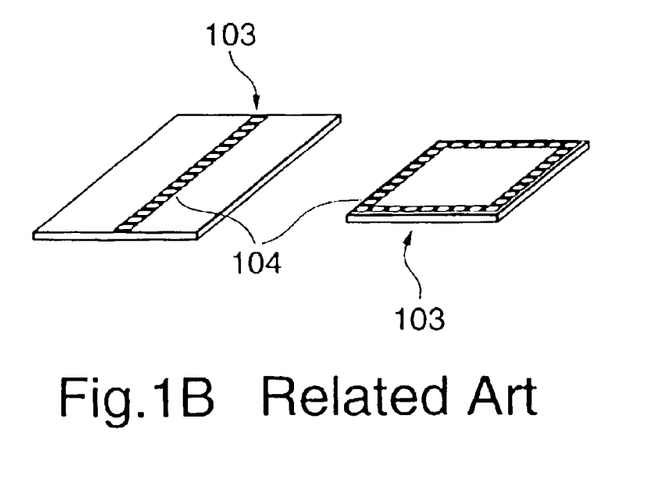
FIG. 1B is a diagram showing the structure of a semiconductor device and a packaging method thereof of the related art.
Figure 1C:
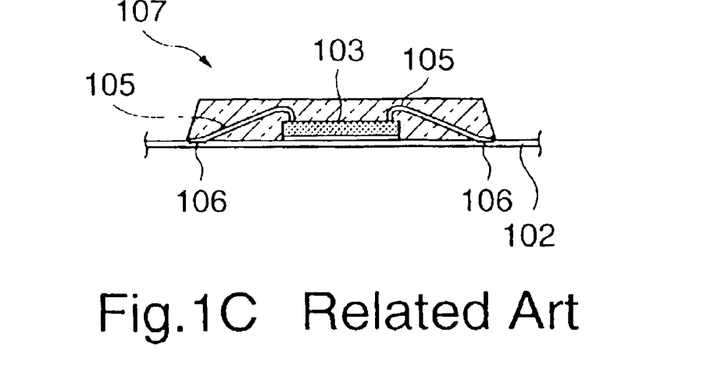
FIG. 1C is a diagram showing the structure of a semiconductor device and a packaging method thereof of the related art.

Heretofore, a high-quality semiconductor chip, particularly a high-quality bare chip (hereinafter HQC) and the efficient acquisition of an HQC has recently been desired. The method of obtaining the HQC will be described hereinbelow with reference to FIGS. 1A to 1C. FIGS. 1A to 1C show a conventional method of screening for a HQC. As shown in FIG. 1A, a predetermined probe test is first made on each semiconductor chip 103 in a semiconductor wafer 101 form. Thereafter, the semiconductor wafer 101 is divided into semiconductor chips 103 as shown FIG. 1B. Electrodes 104 are formed on the surfaces of these semiconductor chips 103 and are arranged almost on the center line of the semiconductor chip 103 or a peripheral edge portion of the semiconductor chip 103, in most cases. Thereafter, the semiconductor chips 103 are selected based on the results of the probe test and are stored in a chip tray or carrier socket for a bum-in test. The bum-in test (to be referred to as "BT" hereinafter) is made on these chips using a HQC special jig and device. The chips which pass the test are taken out from the BT chip tray (or carrier socket), packaged and shipped.

FIG. 1C is a sectional view of a chip, mounted on a mounting substrate, which will be used to describe a packaging procedure. Accordingly, the semiconductor chip 103 is directly mounted on the mounting substrate 102, and the electrodes 104 on the semiconductor chip 103 are connected to the electrodes 106 on the mounting substrate with a bonding wire 105. The semiconductor chip 103 is then sealed with a sealing resin to form a resin sealed package 107.

When an unpackaged semiconductor chip, that is, a bare chip, is screened, as in the prior art, the semiconductor chip or semiconductor wafer is easily broken because it has a thin formation and is susceptible to damage by a socket, probe or tester used for the screening test. Therefore, the specifications of the tester become complicated and the costs of the test become high because of the need for the test to be performed very delicately. The screening test is carried out by contacting the probe to the electrode 104 of the semiconductor chip 103. Since the electrode 104 also serves as a bonding pad for mounting the bare chip on the substrate 102, the surface of the electrode 104 must be prevented from being scratched by the end of the probe. If the surface of the electrode 104 is scratched, the electrode bonding may peel off, and even if the semiconductor chip 103 itself is a HQC, the semiconductor package 106 is regarded as defective, thereby reducing the yield. Further, because of the semiconductor chip's exposure, the chip 103 and wafer 101 are easily affected by environmental factors, such as water and stains that result in the HQC becoming not suitable for the market.

The defective rate of semiconductor packages incorporating a single semiconductor chip, which is unscreened and not a HQC, does not pose a big problem when a screening test and a BT are made on the semiconductor chip in package form. However, in the case of a Multi Chip Package (hereinafter MCP), which is a semiconductor package incorporating a plurality of semiconductor chips, all of the semiconductor chips constituting the MCP are not always a HQC. That is, when a plurality of semiconductor chips, which are unknown as to whether they are a HQC or not, are incorporated in a single semiconductor package, the defective rate may become large due to the multiplication of semiconductor chips, which have the potential to be defective, thereby reducing the yield of the MCP.

It is an object of the present invention to provide a semiconductor chip and device, which is capable of being easily tested for a HQC status and which can retain its quality without being affected by the surrounding environment, and a packaging method thereof.

SUMMARY OF THE INVENTION

A first aspect of the present invention provides a semiconductor device, comprising electrodes formed on the surface of a first resin sealed package for sealing a semiconductor chip with a resin. The resin sealed package comprises a mounting area connected to electrodes of the semiconductor chip, an area to mount an object, and an area for connecting testing equipment.

According to the above structure, the step of selecting a HQC using an inexpensive testing socket or the like can be carried out without the fear of breaking the semiconductor chip. Stated more specifically, the semiconductor chip is incorporated in a resin sealed package and electrodes formed on the surface of the resin sealed package are each divided into a testing area and a mounting area to eliminate the electrode from being scratched by a screening test at the time of packaging. As the semiconductor chip is incorporated in a resin sealed package and handled in a test as an individual piece, the BT can be carried out on the resin sealed package in the same manner as in the prior art. That is, the screening step in the prior art, which needed to be carried out very carefully so as not to scratch the surface electrodes connected to the bonding wires, and to not break the semiconductor chip, can now be carried out easily at a low cost. Further, since the semiconductor chip is incorporated in a resin sealed package, it is hardly affected by the surrounding environment, such as water and stains, and its storage and preservation, which have been very difficult in the prior art, become easy.

The object to be mounted on the resin sealed package is a mounting substrate or a TCP (Tape Carrier Package) when a single resin sealed package incorporating a semiconductor chip is used. In the case of two or more resin sealed packages, each incorporating a semiconductor chip, that is, the MCP, electrodes formed on the surface of one resin sealed package are mounted to another resin sealed package, which in turn is mounted on a mounting substrate or TCP. The equipment used to test the package may be, for example, a testing socket, contact pin, prober or the like.

A second aspect of the present invention provides a semiconductor device comprising a first resin sealed package for sealing a semiconductor chip with a resin, and a second resin sealed package for sealing the first resin sealed package on a mounting substrate. Electrodes are formed on the surface of the first resin sealed package so as to comprise an area to be connected to an electrode of the semiconductor chip, a mounting area for an object, and a testing area for connecting testing equipment.

According to the above structure, there can be provided a HQC which has a mounting area and a testing area and incorporates a resin sealed package (first resin sealed package) in place of a semiconductor chip of the conventional art.

Figure 2:
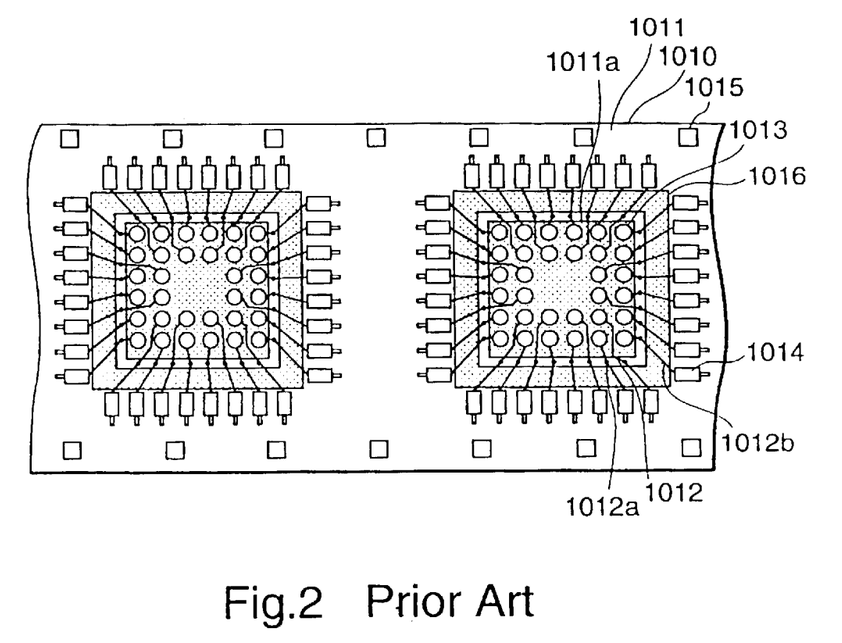
FIG. 2 is a plan view showing a structure used for describing a method of packaging a semiconductor device of the prior art.

Japanese Patent Application Laid-open No. Heisei 11-40617 proposes a technology for providing electrodes for testing a semiconductor chip. The technology will be described hereinbelow with reference to FIG. 2. As shown in FIG. 2, the technology disclosed by Japanese Patent Application Laid-open No. Heisei 11-40617 utilizes test pads 1014 which are formed on a TCP (Tape Carrier Package) 1010 for mounting a semiconductor chip. Connection pads are extended on the TCP 1010 and connected to the electrodes of the semiconductor chip. Numeral 1011 is a tape basement, numeral 1011a is an unit region, numeral 1012 is a wiring pattern, numeral 1012b is wiring extension pattern, numeral 1013 is a terminal for an external connection, numeral 1015 is a sprocket hole and numeral 1016 is a resist film.

However, according to this structure, a high-precision handler or the like must be used to handle the fragile semiconductor chip, as in the prior art, and when the connection pads connected to the semiconductor chip are disconnected from the test pads, there is a possibility that the screening test of the semiconductor chip may not be carried out accurately. The step of producing each of the test pads 1014 is newly required. The present invention makes it possible to screen semiconductor chips easily at a low cost and acquire the HQC with high precision without causing the above problems.

In a third aspect of the present invention, there is provided a semiconductor device, wherein the electrodes formed on the first resin sealed package are wiring electrodes formed on a tape substrate.

According to the above structure, when the first resin sealed package is formed, a semiconductor chip is installed on a tape substrate having wiring electrodes formed thereon through a mounting material (adhesive). The electrodes of the semiconductor chip are connected to the above wiring electrodes, and the semiconductor chip is sealed with a sealing resin. Therefore, the electrodes formed on the surface of the first resin sealed package can be provided reliably and efficiently.

In a fourth aspect of the present invention, there is further provided a semiconductor device, wherein electrodes of a semiconductor chip are connected to electrodes formed on the surface of the first resin sealed package by wire bonding.

Figure 3A:
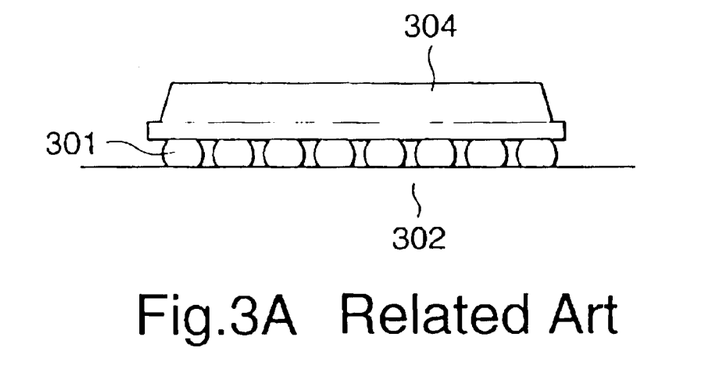
FIG. 3A is a sectional view showing a semiconductor device packaging method of the related art, especially the structure of a CSP using a solder ball.
Figure 3B:
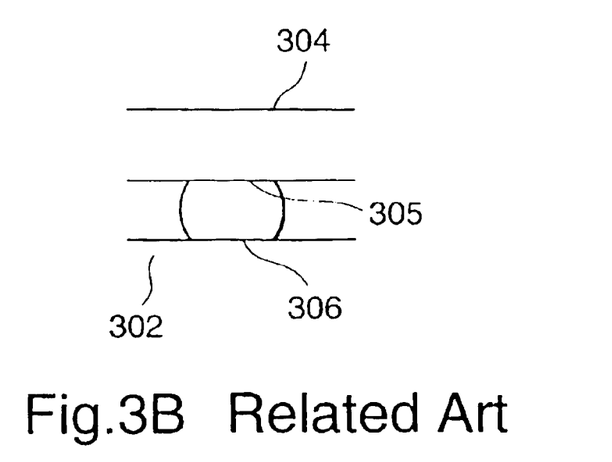
FIG. 3B is a sectional view showing a semiconductor device packaging method of the related art, especially the structure of a CSP using a solder ball.
Figure 3C:
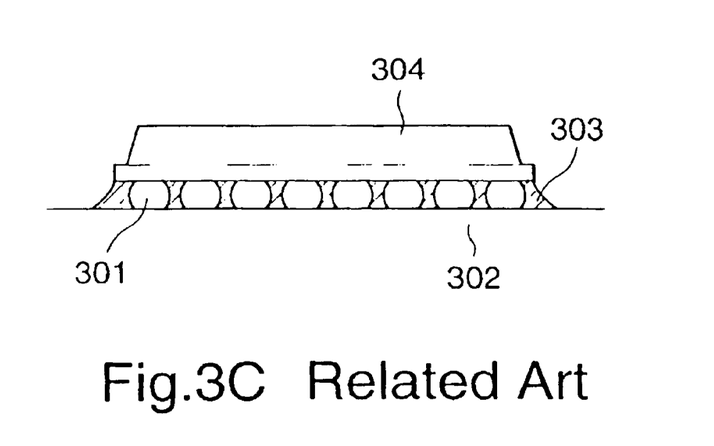
FIG. 3C is a sectional view showing a semiconductor device packaging method of the related art, especially the structure of a CSP using a solder ball.

As shown in FIGS. 3A to 3C, CSP (Chip Size Package) using a solder ball 301 employs an underfilling 303 technology for fixing the solder ball 301 with a resin to prevent stress generated by the expansion of a substrate 302 or the like from being placed on the solder ball 301. Numeral 305 is a boundary between a sealed region of the package and the solder ball. Numeral 306 is a boundary between the solder ball and the substrate.

However, since the resin used in this underfilling technology must fill a very narrow space between a semiconductor package and a substrate in such a manner that it covers the solder ball, a filler must be used that is small and has high fluidity. As a result, an expensive resin is used.

A semiconductor device according to the fourth aspect of the present invention employs wire bonding to ease stress generated by the expansion of a mounting substrate, from the mounting substrate to the top surface of the semiconductor chip. That is, since there is no member whose expansion coefficient greatly differs from that of the mounting substrate, such as a semiconductor chip on the top surface of the bonding portion, the stress applied to the bonding portion of the bonding wire becomes small, thereby improving packaging reliability. Since an expensive resin, such as the above underfiller does not need to be used as a sealing resin, production costs can be reduced. Further, the step of positioning resin sealed packages that are to be connected to each other, and the positioning of the electrodes relative to the mounting substrate, can be eliminated.

A fifth aspect of the present invention provides a semiconductor device, wherein the electrodes on the surface of the first resin sealed package are connected to electrodes on the mounting substrate by wire bonding.

According to the above structure, stress generated by the expansion of the mounting substrate can be relaxed from the mounting substrate to the top surface of the semiconductor chip. That is, there is no member whose expansion coefficient greatly differs from that of the mounting substrate, such as a semiconductor chip on the top surface of the bonding portion. Thus, stress applied to the bonding portion of the bonding wire becomes small and packaging reliability is improved. According to the present invention, an expensive resin such as the above underfiller does not need to be used as a sealing resin, and production costs can be reduced. Further, the step of positioning the resin sealed package that are to be connected to each other, and the positioning of the electrodes relative to the mounting substrate can be eliminated.

A sixth aspect of the present invention provides a semiconductor device, wherein the electrodes of the semiconductor chip and the electrodes on the surface of the first resin sealed package are flip-chip connected to each other.

A seventh aspect of the present invention provides a semiconductor device, wherein the electrodes on the surface of the first resin sealed package and the electrodes on the mounting substrate are flip-chip connected to each other.

A semiconductor device packaging method according to an eighth aspect of the present invention, comprises the steps of connecting the electrodes of a semiconductor chip to electrodes, each of which consists of a mounting area to be connected to an object to be mounted, and a testing area for connecting testing equipment. The method also provides for sealing the semiconductor chip with a resin such that the electrodes, each consisting of the mounting area and the testing area are exposed to the surface to form a first resin sealed package. Further provided is the step of carrying out a burn-in test on the first resin sealed package using the testing areas, and connecting the electrodes on the surface of the first resin sealed package to the electrodes on the mounting substrate to form a second resin sealed package for sealing the first resin sealed package on the mounting substrate with a resin.

By employing the above method, the step of selecting the HQC using an inexpensive testing socket or the like can be carried out without the fear of breaking the semiconductor chip. Stated more specifically, the semiconductor chip is incorporated in a resin sealed package and the electrodes formed on the surface of the resin sealed package are each divided into a testing area and a mounting area to prevent the scratching of electrodes by the screening test at the time of packaging. Since the semiconductor chip is incorporated into a resin sealed package and handled in a test as an individual piece, the BT can be carried out in the same manner as a resin sealed package of the prior art. That is, the screening step which has been carried out very carefully in an effort not to scratch surface electrodes that are connected to bonding wires, and to not break a semiconductor chip, can be carried out easily at a low cost. Further, since the semiconductor chip is incorporated in a resin sealed package, it is hardly affected by the surrounding environment, for example, water and stains, so that its handling, storage and preservation become easy. Therefore, even when the semiconductor device of the present invention is used in a MCP, the incorporated resin sealed package (first resin sealed package) can be regarded as a HQC on which a BT has been made. Thus, the reliability of the MCP improves, thereby making it possible to improve the yield.

In a semiconductor device packaging method according to a ninth aspect of the present invention, the electrodes of the semiconductor chip and the electrodes formed on the surface of the first resin sealed package are connected by wire bonding.

By employing the above method, stress generated by the expansion of the mounting substrate can be eased from the mounting substrate to the top surface of the semiconductor chip. That is, there is no member whose expansion coefficient greatly differs from that of the mounting substrate, such as a semiconductor chip on the top surface of the bonding portion. Accordingly, stress applied to the bonding portion of the bonding wire becomes small and packaging reliability is improved. An expensive resin, such as the previously described underfiller, does not need to be used as a sealing resin, and production costs can be reduced. Further, the step of positioning the resin sealed packages, that are to be connected to each other, and positioning the electrodes relative to the mounting substrate, can be eliminated.

In a semiconductor device packaging method according to a tenth aspect of the present invention, the electrodes on the surface of the first resin sealed package and the electrodes on the mounting substrate are connected by wire bonding.

By employing the above method, stress generated by the expansion of the mounting substrate can be eased from the mounting substrate to the top surface of the semiconductor chip. That is, there is no member whose expansion coefficient greatly differs from that of the mounting substrate, such as a semiconductor chip on the top surface of the bonding portion. Thus, stress applied to the bonding portion of the bonding wire becomes small and packaging reliability is improved. An expensive resin, such as the above underfiller, does not need to be used as a sealing resin, and production costs can be reduced. Further, the step of positioning the resin sealed packages, that are to be connected to each other, and positioning the electrodes relative to the mounting substrate, can be eliminated.

In a semiconductor device packaging method according to an eleventh aspect of the present invention, the electrodes of the semiconductor chip and the electrodes on the surface of the first resin sealed package are flip-chip connected to each other.

A semiconductor device packaging method according to a twelfth invention is also provided to solve the above problems. This embodiment is characterized in that, in the semiconductor device packaging method, the electrodes on the surface of the first resin sealed package, and the electrodes on the mounting substrate, are flip-chip connected to each other.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

The First Embodiment

Figure 4A:
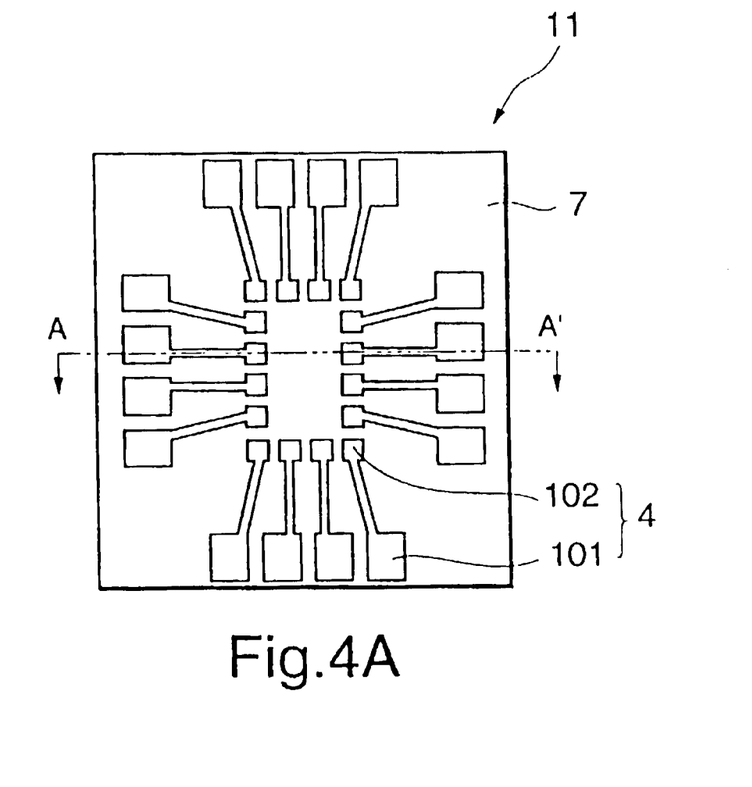
FIG. 4A is a plan view and a sectional view showing a semiconductor device according to an embodiment of the present invention.
Figure 4B:
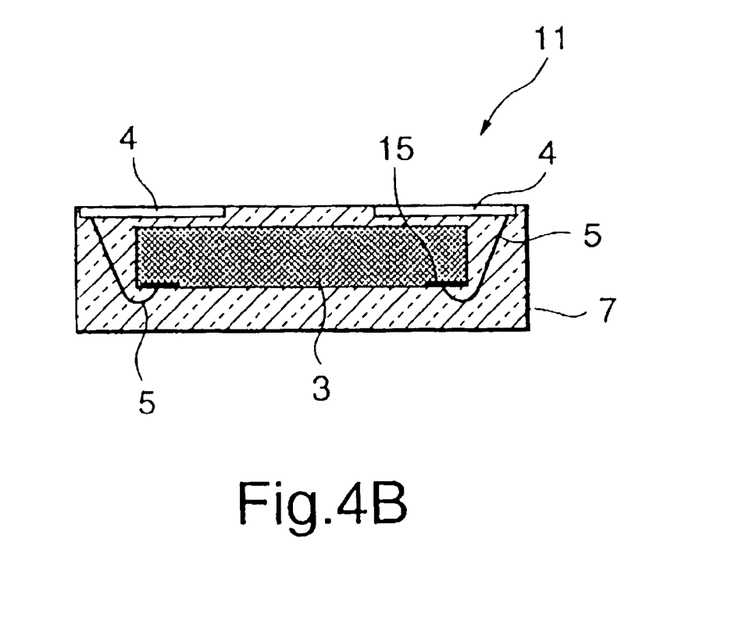
FIG. 4B is a sectional view and a sectional view showing a semiconductor device according to an embodiment of the present invention.

A semiconductor device and a packaging method thereof according to an exemplary embodiment of the present invention will be described hereinbelow with reference to FIGS. 4A, 4B, 5A and 5B. In the description of the semiconductor device and packaging method thereof according to the present invention, a semiconductor device to be mounted on a mounting substrate is designated as a first resin sealed package and a semiconductor device already mounted on the mounting substrate is designated as a second resin sealed package. FIG. 4A is a plan view showing the constitution of a semiconductor device according to an embodiment of the present invention and FIG. 4B is a sectional view cut on A–A' of FIG. 4A. As shown in FIG. 4A, the semiconductor device of the present invention, especially a first resin sealed package 11 is made from a first sealing resin 7 which seals a semiconductor chip (not shown) with a resin such that it incorporates the semiconductor chip and a plurality of electrodes 4, each consisting of a mounting area 101 and a testing area 102 formed on the surface. The electrodes 4 are installed along a peripheral edge portion of the first resin sealed package 11. The mounting area 101 is formed at an outer portion of each electrode 4 and the testing area 102 is formed at an inner portion of each electrode 4 to reduce the connection distance for mounting the first resin sealed package 11 on a mounting substrate (not shown).

As shown in FIG. 4B, in the first resin sealed package 11, the semiconductor chip 3 is sealed with a first sealing resin 7. The electrodes 4 formed on the surface of the first resin sealed package 11 and the electrodes 15 of the semiconductor chip are electrically connected by first bonding wires 5. That is, the electrodes of the semiconductor chip 3 are also installed on the peripheral edge portion of the semiconductor chip similar to the positional relationship between the first resin sealed package 11 and the electrodes 4.

Since the semiconductor device of the present invention is thus packaged before it is mounted on the mounting substrate, an inexpensive testing socket can be used to test the semiconductor chip without interfering with the integrity of the chip, as in the prior art. Since the semiconductor device of the present invention is packaged in advance, it is not affected by the surrounding environment, for example, water contamination or stains. Thus, its handling, storage and preservation becomes easy.

Further, each of the electrodes 4, comprises two regions, which are a mounting area 101 and a testing area 102, in the semiconductor device of the present invention. The end of a testing probe contacts the testing area 102, and the connection between the semiconductor device and the mounting substrate 2 can be carried out using the mounting area 101 independently. This prevents the electrodes of the semiconductor device product from being scratched by the end of the probe in the testing step and exfoliation or the like in the bonding step.

Therefore, the packaged semiconductor device of the present invention makes it possible to carry out screening, such as with the BT with higher reliability than in the prior art and prevents exfoliation of the bonding portion, whereby the HQC can be obtained efficiently.

Figure 5A:
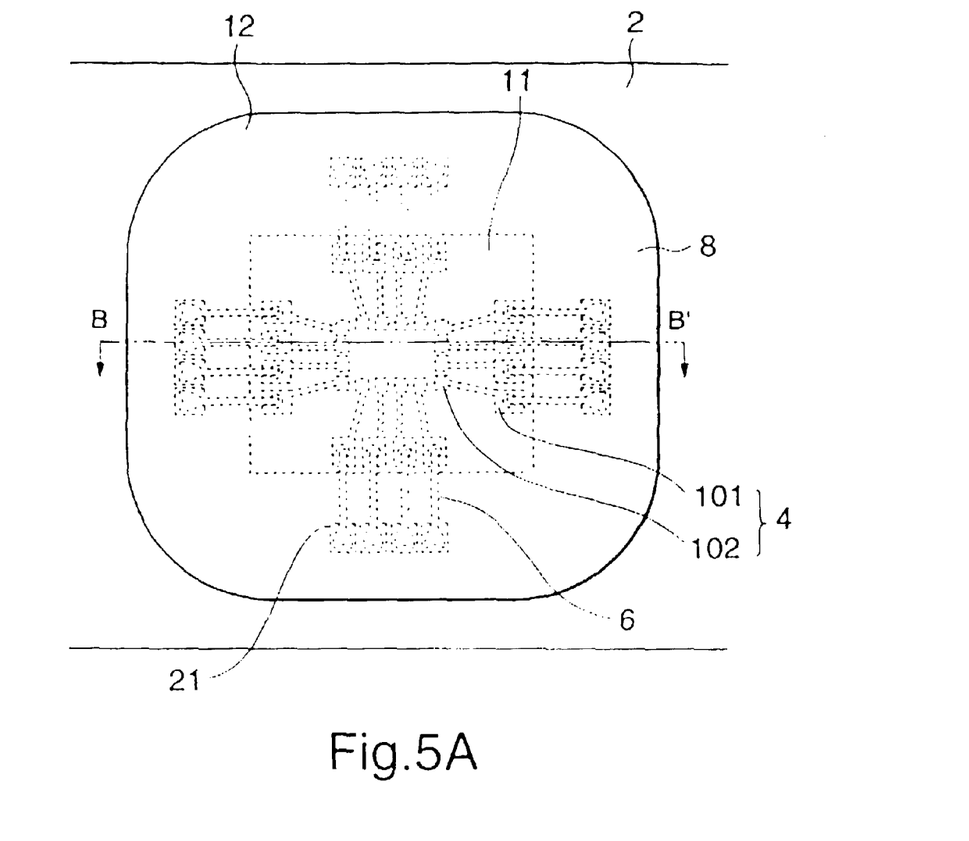
FIG. 5A is a plan view showing a structure used for describing a method of packaging the semiconductor device of the present invention according to an embodiment of the present invention.
Figure 5B:
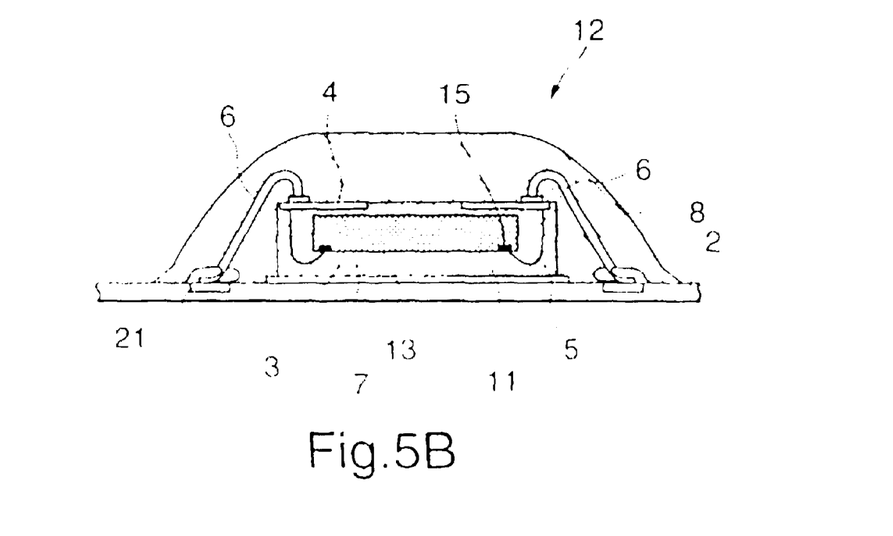
FIG. 5B is a sectional view showing a structure used for describing a method of packaging the semiconductor device of the present invention according to an embodiment of the present invention.

The method of packaging the semiconductor device of the present invention according to an embodiment of the present invention will be described hereinbelow with reference to FIGS. 5A and 5B. FIG. 5A is a plan view showing the method of packaging the semiconductor device of the present invention according to this embodiment of the present invention and FIG. 5B is a sectional view cut on B–B' of FIG. 5A. As shown in FIG. 5A, a plurality of terminals 21 on the mounting substrate are installed on a mounting substrate 2 for mounting the semiconductor device of the present invention. A testing probe or testing socket is connected to the testing areas 102 of the electrodes 4. The mounting areas 101 of the electrodes 4 of the first resin sealed package 11 are electrically connected to the terminals 21 on the mounting substrate by respective second bonding wires 6. Thereafter, a second sealing resin 8 is formed on the mounting substrate 2 such that it covers the first resin sealed package 11 and the terminals 21, whereby the HQC is mounted on the mounting substrate 2. Thus, the semiconductor device of the present invention is mounted on the mounting substrate 2 as a bare chip on which the BT can be made. The semiconductor device can be handled as the HQC, while preventing exfoliation of the electrodes or the like.

An exemplary embodiment of the structure of the semiconductor device of the present invention, which is mounted on the mounting substrate, will be described hereinbelow with reference to FIG. 5B. As shown in FIG. 5B, the terminals 21 are provided on the mounting substrate 2 and are electrically connected to the electrodes 4 of the first resin sealed package 11 installed on the mounting substrate 2 through a mounting material 13 by the second bonding wires 6. The first resin sealed package 11 seals the semiconductor chip 3 with a first sealing resin 7 and the electrodes 15 of the semiconductor chip 3 are electrically connected to the above electrodes 4 by first bonding wires 5. The first resin sealed package 11 mounted on the mounting substrate 2 is sealed with a second sealing resin 8 together with the second bonding wires 6 and mounted on the mounting substrate 2, such that it is incorporated in the second resin sealed package 12.

The Second Embodiment

Figure 6A:
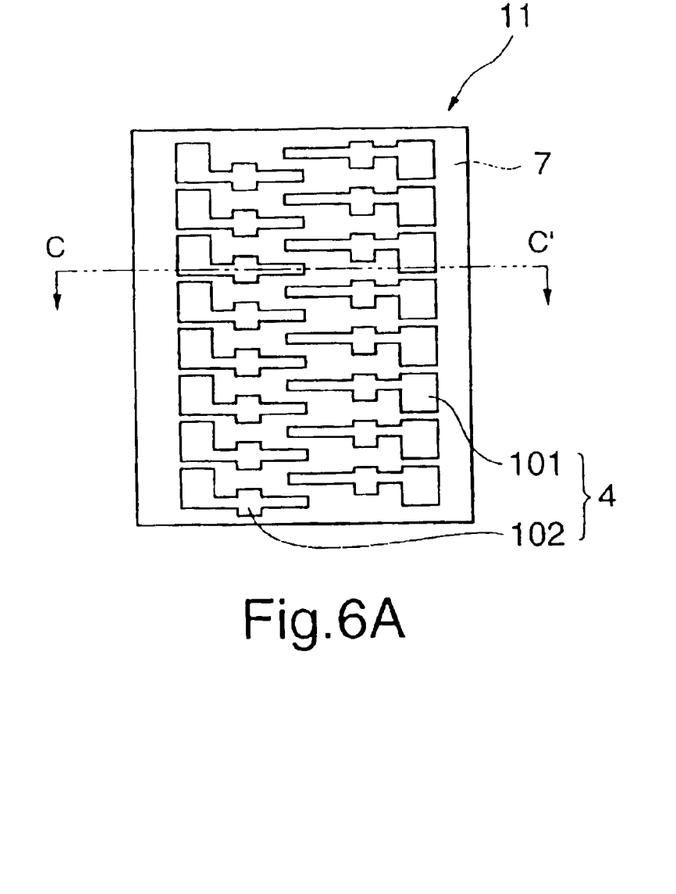
FIG. 6A is a plan view showing the structure of a semiconductor device according to another embodiment of the present invention.
Figure 6B:
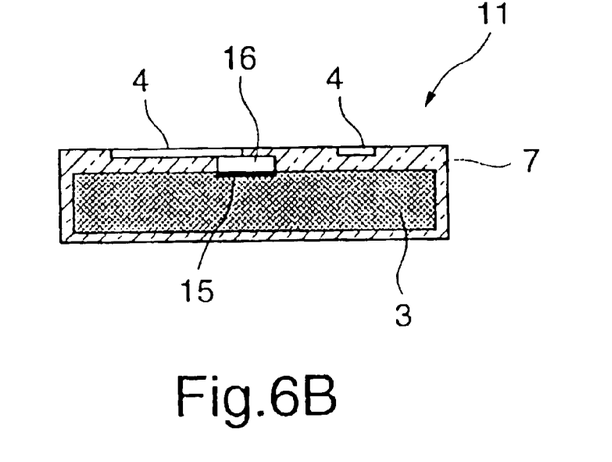
FIG. 6B is a sectional view showing the structure of a semiconductor device according to another embodiment of the present invention.

A semiconductor device and a packaging method thereof according to another embodiment of the present invention will be described hereinbelow with reference to FIGS. 6A, 6B, 7A and 7B. FIG. 6A is a plan view showing the structure of a semiconductor device according to an embodiment of the present invention and FIG. 6B is a sectional view cut on C–C' of FIG. 6A. As shown in FIG. 6A, the semiconductor device according to this embodiment of the present invention, includes the first resin sealed package 11 made from a sealing resin 7 for sealing a semiconductor chip (not shown) with a resin such that it incorporates the semiconductor chip and a plurality of electrodes 4, each electrode comprises two regions, which are a mounting area 101 and a testing area 102, formed on the surface. The electrodes 4 are formed on the surface of the first resin sealed package 11 in such a manner that two groups of electrodes 4 face each other in a comb-like form. To shorten the connection distance when the first resin sealed package 11 is mounted on the mounting substrate (not shown), the mounting area 101 is formed at an outer portion of each electrode 4 and the testing area 102 is formed at an inner portion of each electrode 4.

As shown in FIG. 6B, the first resin sealed package 11 is such that the semiconductor chip 3 is sealed with a first sealing resin 7, and the electrodes 4 formed on the surface of the first resin sealed package 11 and the electrodes 15 of the semiconductor chip 3 are flip-chip connected to each other by a conductive ball 16. That is, the semiconductor device of the present invention shown in FIG. 6B employs a center pad layout such that the electrodes of the semiconductor chip 3 are arranged almost at the center of the surface of the semiconductor chip 3. In one embodiment, a conductive ball is used to cement the chip electrode to a first electrode region. The pad layout of the semiconductor chip employed in the semiconductor device according to this embodiment of the present invention may be employed for the flip-chip connection of the electrodes of the semiconductor chip 3 and the electrodes 4 of the first resin sealed package 11.

Figure 7A:
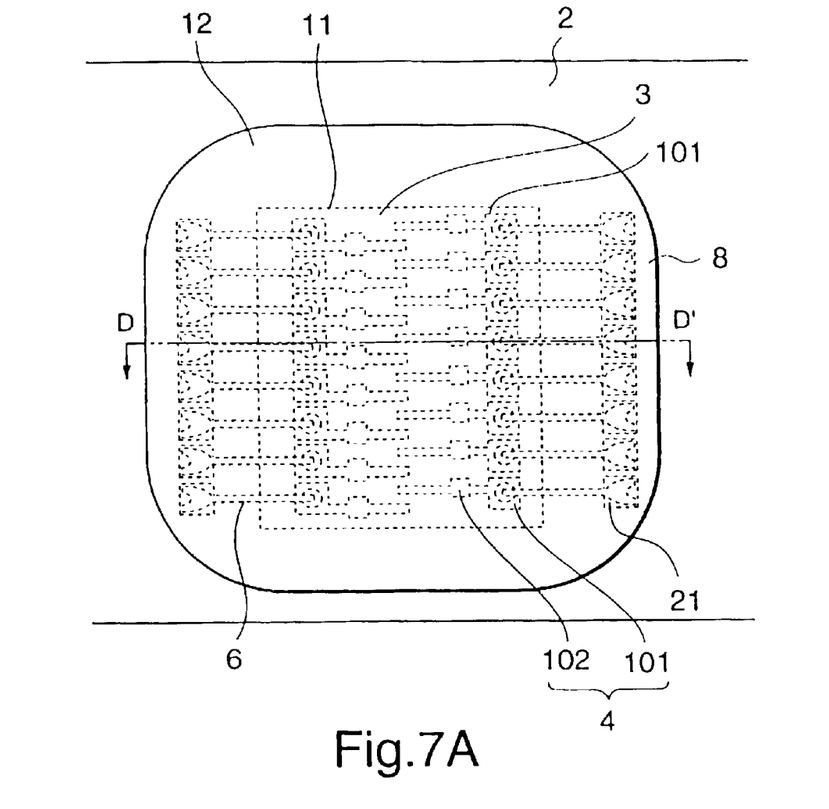
FIG. 7A is a plan view showing a structure used for describing a method of packaging the semiconductor device of the present invention according to another embodiment of the present invention.
Figure 7B:
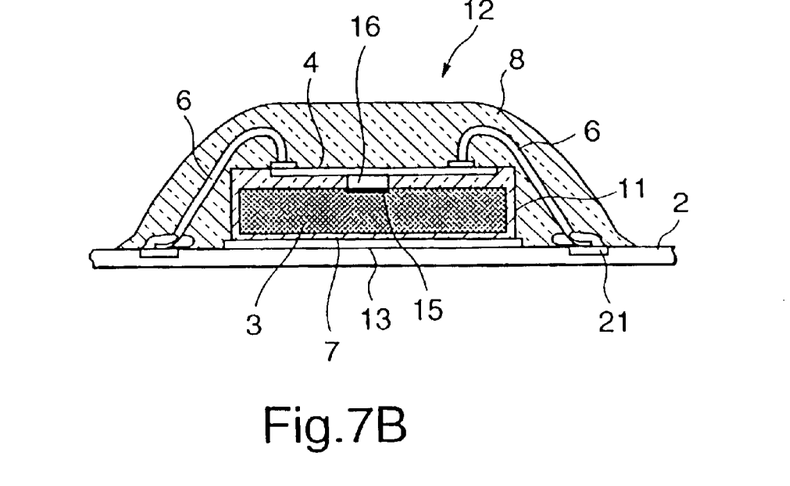
FIG. 7B is a sectional view showing a structure used for describing a method of packaging the semiconductor device of the present invention according to another embodiment of the present invention.

The method of packaging the semiconductor device of the present invention according to another embodiment of the present invention will be described hereinbelow with reference to FIGS. 7A and 7B. FIG. 7A is a plan view showing the packaging method according to an embodiment of the present invention and FIG. 7B is a sectional view cut on D–D' of FIG. 7A. As shown in FIG. 7A, a plurality of terminals 21 on the mounting substrate are installed on the mounting substrate 2 for mounting the semiconductor device of the present invention. A testing probe or testing socket is connected to the testing area 102 of each electrode 4 and the mounting areas 101 of the electrodes 4 of the first resin sealed package 11, which is recognized as the HQC by the BT, are electrically connected to the terminals 21 on the mounting substrate by second bonding wires 6. Thereafter, a second sealing resin 8 is formed on the mounting substrate 2 to cover the first resin sealed package 11 and the terminals 21 on the mounting substrate, so as to mount the HQC on the mounting substrate 2.

The structure of the semiconductor device of the present invention mounted on the mounting substrate will be described hereinbelow with reference to FIG. 7B. As shown in FIG. 7B, the electrodes 21 are formed on the mounting substrate 2 and are electrically connected to the electrodes 4 of the first resin sealed package 11 installed on the mounting substrate 2 through a mounting material 13 by second bonding wires 6. The first resin sealed package 11 is such that the semiconductor chip 3 is sealed with a first sealing resin 7, and the electrodes 15 of the semiconductor chip 3 and the above electrodes 4 are flip-chip connected to each other by a conductive ball 16. The first resin sealed package 11 installed on the mounting substrate 2 is sealed with a second sealing resin 8 together with the second bonding wires 6 and is mounted on the mounting substrate 2 such that it is incorporated in the second resin sealed package 12.

The Third Embodiment

Figure 8A:
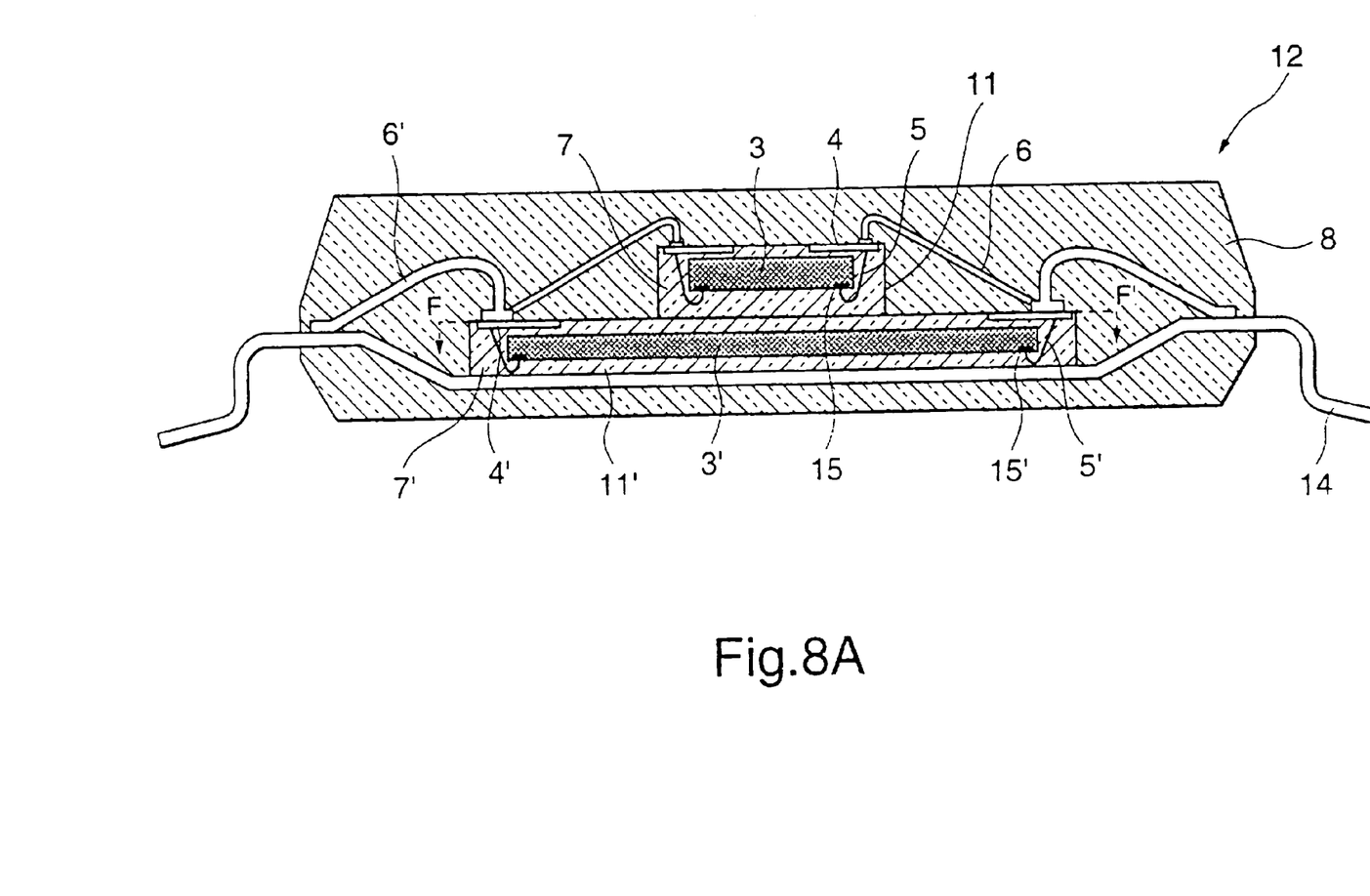
FIG. 8A is a sectional view showing a structure used for describing a method of packaging the semiconductor device of the present invention according to still another embodiment of the present invention as applied to a MCP.
Figure 8B:
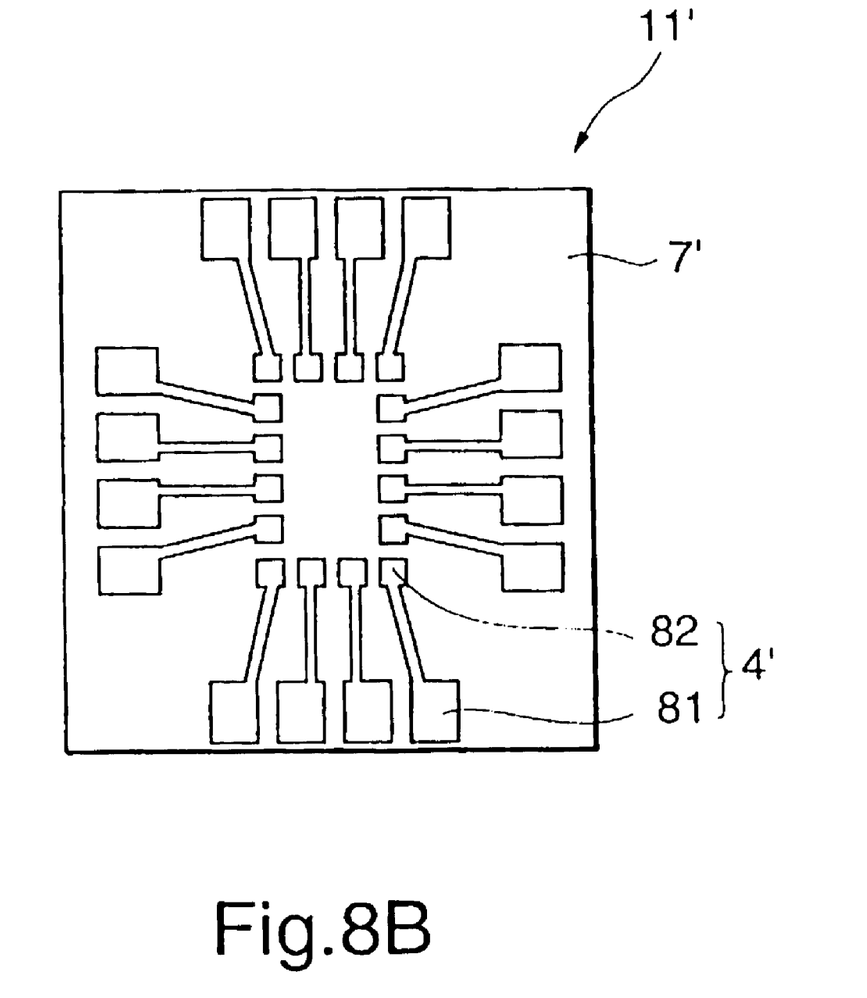
FIG. 8B is a plan view and a sectional view showing a semiconductor device according to an embodiment of the present invention, taken along the cut F–F' of FIG. 8A.

An embodiment when the semiconductor device of the present invention is applied to a MCP will be described hereinbelow with reference to FIGS. 8A and 8B. FIG. 8A is a sectional view of an embodiment when the semiconductor device of the present invention is applied to a MCP. As shown in FIG. 8A, a second resin sealed package 12 is mounted on the mounting substrate or lead frame 14, and a first resin sealed package 11 and a first resin sealed package 11' are mounted on lead frames 14 connected to electrodes on the mounting substrate and sealed with a second sealing resin 8. At this point, the first resin sealed package 11 and the first resin sealed package 11' incorporate a semiconductor chip 3 and a semiconductor chip 3', respectively, and their constructions are as described above. The first resin sealed package 11 comprises electrodes 4, having two regions as discussed above, a first bonding wire 5, a second bonding wire 6, a first sealing resin 7 and a chip electrode 15. The second resin sealed package 11' comprises electrodes 4', having two regions, which are a mounting area 81 and a testing area 82, as shown in FIG. 8B. Also provided is a first bonding wire 5', a second bonding wire 6', a first sealing resin 7' and a chip electrode 15'.

When the semiconductor device of the present invention is to be applied to the MCP, the electrodes 4 of the first resin sealed package 11 are connected to the electrodes 4' of the first resin sealed package 11', which mounts the first resin sealed package 11 by second bonding wires 6. The electrodes 4' of the first resin sealed package 11' and the lead frames 14 are connected by the second bonding wires 6'. Thus, by applying the semiconductor device of the present invention to the MCP, the resin sealing packages (first resin sealed packages) to be incorporated in the resin sealed package (second resin sealed package) to be mounted on the mounting substrate can be screened by the BT or the like. Therefore, the above incorporated resin sealed packages (first resin sealed packages) can be handled as the HQC and can have higher reliability than conventional the Chip on Board (COB).

The Fourth Embodiment

Figure 9A:
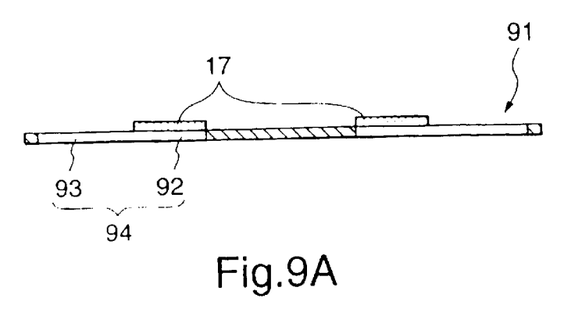
FIG. 9A is a sectional view showing a TCP representing a method of packaging the semiconductor device of the present invention according to a further embodiment of the present invention.
Figure 9B:
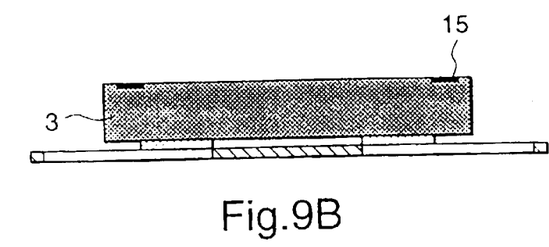
FIG. 9B is a sectional view showing a TCP representing a method of packaging the semiconductor device of the present invention according to a further embodiment of the present invention.
Figure 9C:
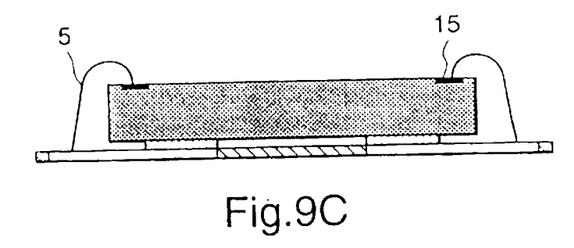
FIG. 9C is a sectional view showing a TCP representing a method of packaging the semiconductor device of the present invention according to a further embodiment of the present invention.
Figure 9D:
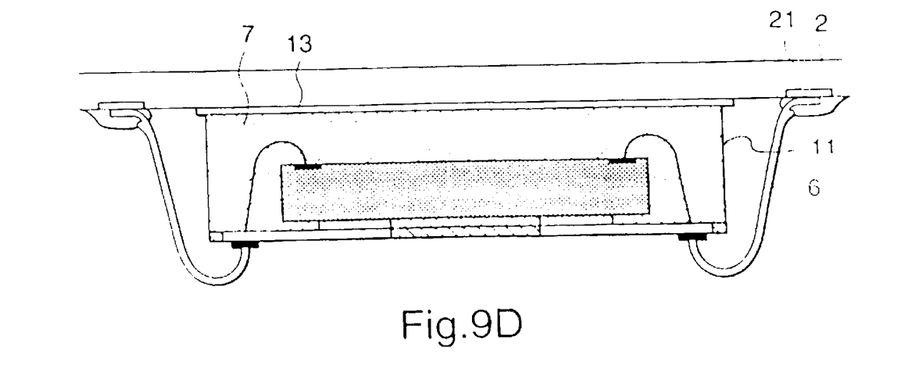
FIG. 9D is a sectional view showing a TCP representing a method of packaging the semiconductor device of the present invention according to a further embodiment of the present invention.
Figure 9E:
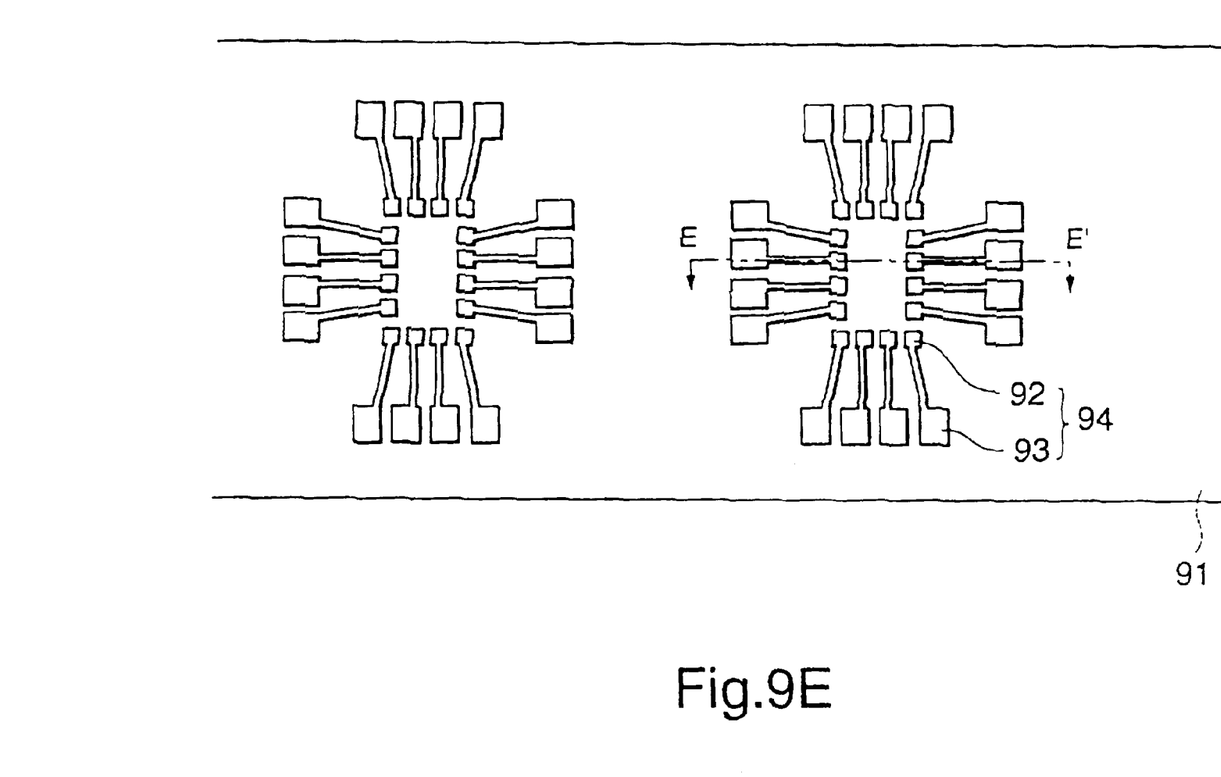
FIG. 9E is a plan view showing the structure of a tape substrate used for a TCP representing a method of packaging the semiconductor device of the present invention according to a further embodiment of the present invention.

In addition, in the semiconductor device of the present invention, the electrodes formed on the surface of the first resin sealed package may be connected to wiring electrodes formed on the tape substrate (hereinafter TS). Stated more specifically, as shown in FIGS. 9A and 9B, a semiconductor chip 3 is installed on the TS 91 having electrodes 94 (wiring electrodes) each comprising two regions, which are a testing area 92 and a mounting area 93 formed thereon through a mounting material 17 (adhesive), the electrodes 94 are connected to the electrodes 15 of the semiconductor chip 3 by a first bonding wire 5, as shown in FIG. 9C, and the semiconductor chip is sealed with a first sealing resin 7 such that the electrodes 94 are exposed to the surface, as shown in FIG. 9D. Accordingly, an electrode 21 is formed on the mounting substrate 2 and is electrically connected to the electrodes 94 of the first sealed package 11, which is installed on the mounting substrate 2 through a mounting material 13, by second bonding wires 6. FIG. 9E is a plan view of the tape substrate 91. FIG. 9A is a sectional view cut on E–E' of FIG. 9E (except for the mounting material 17).

By forming the first resin sealed package 11 as described above, a screening test can be carried out more easily and reliably than when a fragile semiconductor chip is used as in the prior art and the time and labor required for molding the first resin sealed package are reduced as the TCP is used. Also, the resin sealed package may be mounted on a substrate. Therefore, by connecting the electrodes formed on the surface of the first resin sealed package to wiring electrodes formed on the TS, the production yield of the first resin sealed package can be improved. The present invention provides a semiconductor device which incorporates a semiconductor chip having a first resin sealed package and a second resin sealed package comprising electrodes, each consisting of a testing area and a mounting area, irrespective of an object to be mounted and a packaging method thereof.

As having been described above, the semiconductor device and packaging method thereof of the present invention makes it possible to carry out the step of screening for a HQC using an inexpensive testing socket or the like without the fear of breaking a semiconductor chip. Stated more specifically, the semiconductor chip is incorporated in a resin sealed package and each of the electrodes provided on the surface of the resin sealed package is divided into a testing area and a mounting area, thereby eliminating scratched electrodes caused by a screening test at the time of packaging. Since the semiconductor chip is incorporated in a resin sealed package and handled in a test as an individual piece, the BT can be carried out in the same manner as the resin sealed package of the prior art. That is, the screening step which has been carried out very carefully not to scratch the electrodes connected to the bonding wires and to not break a semiconductor chip, can be carried out easily at a low cost. Further, since the semiconductor chip is incorporated in a resin sealed package, it is not affected by the surrounding environment, for example, water and stains, and its handling, including storage and preservation becomes easy. Therefore, even when the semiconductor device of the present invention is applied to the MCP, as the resin sealed package (first resin sealed package) to be incorporated, the semiconductor device can be regarded as the HQC on which the BT has been made. Thus, the reliability of the MCP improves, thereby making it possible to improve the yield.

The present invention is not limited to the above embodiments, and it is contemplated that numerous modifications may be made without departing from the spirit and scope of the invention. The package structure, as described above with reference to the drawings, is a merely an exemplary embodiment of the invention, and the scope of the invention is not limited to these particular embodiments. Accordingly, other structural configurations may be used, without departing from the spirit and scope of the invention as defined in the following claims.

What is claimed is:

1. A semiconductor device comprising:
    a first resin package comprising:
        a semiconductor chip;
        a chip electrode on a surface of said semiconductor chip;
        a first resin sealing said semiconductor chip; and
        a first package electrode on a surface of said first resin being electrically connected to said chip electrode, said first package electrode comprising a mounting pad and a testing pad provided apart from said mounting pad and said testing pad enabling electrical measurement of said semiconductor chip without using said mounting pad;
    a mounted object connected to said mounting pad, and
    a wiring connecting said mounting pad to said mounting object,
    wherein said mounting pad is arranged along an edge of said first resin package, and wherein said testing pad is arranged at inner position with respect to said mounting pad.

2. The semiconductor device as claimed in claim 1, further comprising:
    a second resin sealing said first resin package and a first surface of said mounted object.

3. The semiconductor device as claimed in claim 2, further comprising:
    an inner wiring connecting said chip electrode to said mounting pad.

4. The semiconductor device as claimed in claim 1, wherein said mounted object is a mounting substrate.

* * * * *